United States Patent
Oh et al.

(10) Patent No.: US 10,026,924 B2
(45) Date of Patent: *Jul. 17, 2018

(54) ORGANIC LIGHT EMITTING DISPLAY APPARATUS AND MANUFACTURING METHOD THEREOF

(71) Applicant: Samsung Display Co., Ltd., Yongin-si, Gyeonggi-do (KR)

(72) Inventors: Hyun-Joon Oh, Yongin-si (KR); Kie-Hyun Nam, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/347,726

(22) Filed: Nov. 9, 2016

(65) Prior Publication Data

US 2017/0054109 A1 Feb. 23, 2017

Related U.S. Application Data

(63) Continuation of application No. 13/831,474, filed on Mar. 14, 2013, now Pat. No. 9,525,153.

(30) Foreign Application Priority Data

Nov. 23, 2012 (KR) ........................ 10-2012-0133938

(51) Int. Cl.
*H01L 51/52* (2006.01)
*H01L 27/32* (2006.01)

(52) U.S. Cl.
CPC ........ *H01L 51/5253* (2013.01); *H01L 51/524* (2013.01); *H01L 51/525* (2013.01); *H01L 51/5246* (2013.01); *H01L 51/5259* (2013.01); *H01L 27/3244* (2013.01); *H01L 51/5237* (2013.01)

(58) Field of Classification Search
None
See application file for complete search history.

(56) References Cited

U.S. PATENT DOCUMENTS

| 9,525,153 B2 * | 12/2016 | Oh ...................... H01L 51/524 |
| 2007/0025121 A1 | 2/2007 | Harada et al. |
| 2009/0039780 A1 | 2/2009 | Kim et al. |
| 2009/0243474 A1 | 10/2009 | Kase et al. |
| 2011/0105637 A1 | 5/2011 | Fujita et al. |
| 2011/0157540 A1 | 6/2011 | Jung et al. |

FOREIGN PATENT DOCUMENTS

| JP | 2006-228519 | 8/2006 |
| JP | 2007-112956 | 5/2007 |
| JP | 2010-111743 | 5/2010 |
| KR | 10-2011-0075363 | 7/2011 |
| WO | WO 2007/049385 A1 | 5/2007 |

* cited by examiner

*Primary Examiner* — Anh Mai
*Assistant Examiner* — Zachary J Snyder
(74) *Attorney, Agent, or Firm* — Lewis Roca Rothgerber Christie LLP

(57) ABSTRACT

An organic light emitting display device includes a substrate, a display unit on the substrate, a sealing substrate on the display unit, a sealing member around the display unit and bonding the substrate and the sealing substrate, and a filler inside the sealing member and filling a gap between the substrate and the sealing substrate, wherein the filler is a non-hardening type, and a molecular weight of the filler is from about 100 kg/mol to about 5,000 kg/mol.

12 Claims, 4 Drawing Sheets

(a)                                    (b)

ORGANIC LIGHT EMITTING DISPLAY APPARATUS AND MANUFACTURING METHOD THEREOF

CROSS-REFERENCE TO RELATED PATENT APPLICATION

This application is a continuation of U.S. patent application Ser. No. 13/831,474, filed Mar. 14, 2013, which claims priority to and the benefit of Korean Patent Application No. 10-2012-0133938, filed Nov. 23, 2012, the entire content of both of which is incorporated herein by reference.

BACKGROUND

1. Field

Embodiments of the present invention relate to an organic light emitting device and a method of manufacturing the same.

2. Description of the Related Art

Recently, thin flat panel display devices have been widely used. An electroluminescent display device among the flat panel display devices is a self light-emitting display device that has a wide viewing angle, has excellent contrast, and has a fast response speed. Therefore, the electroluminescent display receives attention as a next-generation display device. An organic light emitting display device, in which a light emitting layer is formed of an organic material, has excellent characteristics of luminance, driving voltage, and response speed in comparison with an inorganic light emitting display device, and also enables multi-colorization.

The organic light emitting display device includes a substrate provided with a display unit and a sealing substrate located on the display unit, wherein the substrate and the sealing substrate are bonded by a sealant. However, as a size of the organic light emitting display device increases, a size and weight of the sealing substrate increase. Accordingly, to secure mechanical reliability of the organic light emitting display device, a technique of filling a gap between the substrate and the sealing substrate with a filler has been developed.

Typically, the filler is a thermosetting type or an ultraviolet curing type, and an additive such as a hardening agent that may react with heat or ultraviolet light is mixed therewith. However, organic materials in the additive have strong reactivity. Therefore, when heat or ultraviolet light is radiated, the organic materials may react with an organic light emitting element, causing defects such as a dark spot and pixel shrinkage.

SUMMARY

Embodiments of the present invention provide an organic light emitting device including a non-hardening type filler and a method of manufacturing the same.

According to an aspect of embodiments of the present invention, there is provided an organic light emitting display device including a substrate, a display unit on the substrate, a sealing substrate on the display unit, a sealing member around the display unit and bonding the substrate and the sealing substrate, and a filler inside the sealing member and filling a gap between the substrate and the sealing substrate, wherein the filler is a non-hardening type, and a molecular weight of the filler is from about 100 kg/mol to about 5,000 kg/mol.

A glass transition temperature of the filler may be from about −30° C. to about 30° C.

The filler may include a polymer including a polymerized adhesive component monomer and cohesive component monomer.

The filler may include the adhesive component monomer having a molecular weight from about 10 mol % to about 90 mol %, and the cohesive component monomer having a molecular weight from about 10 mol % to about 90 mol %.

The molecular weight of the adhesive component monomer may be from about 60 mol % to about 80 mol %, and the molecular weight of the cohesive component monomer may be from about 20 mol % to about 40 mol %.

The adhesive component monomer may include at least one of butyl acrylate, 2-ethyl-hexyl acrylate, octyl acrylate, or ethyl acrylate.

The cohesive component monomer may include at least one of methyl methacrylate, styrene, methyl acrylate, or acrylonitrile.

A thermal change ratio of the filler is about 2% or less when a temperature is about 100° C.

The organic light emitting display device may further include a moisture absorbent inside the sealing member.

The filler may cover the display unit.

According to another aspect embodiments of the present invention, there is provided an organic light emitting display device including a substrate, a display unit on the substrate, a sealing substrate on the display unit, a sealing member bonding the substrate and the sealing substrate, and sealing the display unit, and a filler inside the sealing member and filling a gap between the substrate and the sealing substrate, wherein the filler includes a non-hardening type polymer including polymerized adhesive component monomer and cohesive component monomer.

A glass transition temperature of the filler is from about −30° C. to about 30° C., and a molecular weight of the filler may be from about 100 kg/mol to about 5,000 kg/mol.

The adhesive component monomer may have a molecular weight from about 10 mol % to about 90 mol %, and the cohesive component monomer may have a molecular weight from about 10 mol % to about 90 mol %.

The adhesive component monomer may have a molecular weight from about 60 mol % to about 80 mol %, and the cohesive component monomer may have a molecular weight from about 20 mol % to about 40 mol %.

The adhesive component monomer may include at least one of butyl acrylate, 2-ethyl-hexyl acrylate, octyl acrylate, or ethyl acrylate.

The cohesive component monomer may include at least one of methyl methacrylate, styrene, methyl acrylate, or acrylonitrile.

The organic light emitting display device may further include a moisture absorbent inside the sealing member.

According to another aspect of embodiments of the present invention, there is provided a method of manufacturing an organic light emitting display device, the method including forming a display unit on a substrate, applying a polymer filler, which is formed by polymerizing an adhesive component monomer and a cohesive component monomer, onto a sealing substrate, forming a sealing member on the substrate or the sealing substrate, and bonding the substrate and the sealing substrate using the sealing member, wherein a molecular weight of the filler is from about 100 kg/mol to about 5,000 kg/mol, and wherein a glass transition temperature of the filler is from about −30° C. to about 30° C.

The polymer may be formed by suspension-polymerizing or solution-polymerizing the adhesive component monomer and the cohesive component monomer with an initiator, and by removing the initiator and unreactive material by performing solvent cleaning and heat treatment.

A molecular weight of the initiator may be about 1 mol % or less.

The adhesive component monomer may include at least one of butyl acrylate, 2-ethyl-hexyl acrylate, octyl acrylate, or ethyl acrylate.

The cohesive component monomer may include at least one of methyl methacrylate, styrene, methyl acrylate, or acrylonitrile.

BRIEF DESCRIPTION OF THE DRAWINGS

The above and other aspects of the present invention will become more apparent by describing in detail exemplary embodiments thereof with reference to the attached drawings in which.

DETAILED DESCRIPTION

Figure 1:
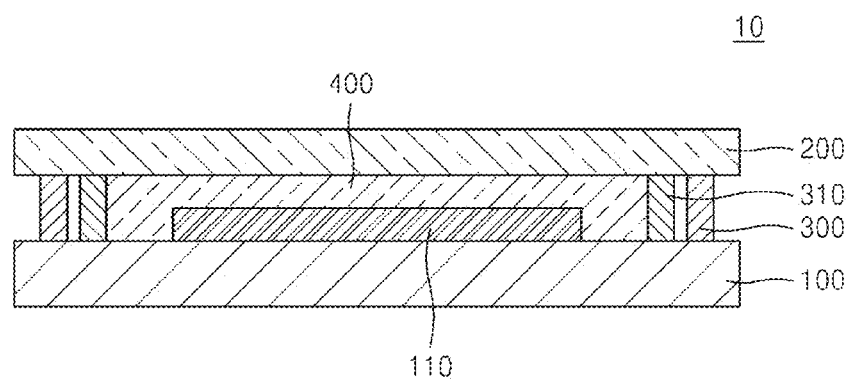
FIG. 1 is a cross-sectional view schematically illustrating a cross section of an organic light emitting display device according to an embodiment of the present invention.

The present invention may be variously modified and may include various embodiments. However, particular embodiments are exemplarily illustrated in the drawings and will be described in detail. However, it should be understood that the particular embodiments are not intended to limit the present disclosure to specific forms, but rather the present disclosure is meant to cover all modification, similarities, and alternatives which are included in the spirit and scope of the present disclosure. Detailed descriptions of well-known functions or configurations will be omitted to not obscure the focus of the present invention.

Relational terms, such as first, second, and the like, may be used for describing various elements, but the elements should not be limited by the terms. The terms are used solely for distinguishing one element from another.

When a layer (or film) is referred to as being cony another layer or substrate, it can be directly on the other layer or substrate, or one or more intervening layers may also be present.

Hereinafter, embodiments of the present invention will be described in detail with reference to the accompanying drawings. Like reference numerals refer to like elements throughout, and overlapping descriptions are omitted. In the drawings, the dimensions of layers and regions may be magnified or exaggerated for clarity of illustration. As used herein, the term "and/or" includes any and all combinations of one or more of the associated listed items. Expressions such as "at least one of," when preceding a list of elements, modify the entire list of elements, and do not modify the individual elements of the list.

Figure 2:
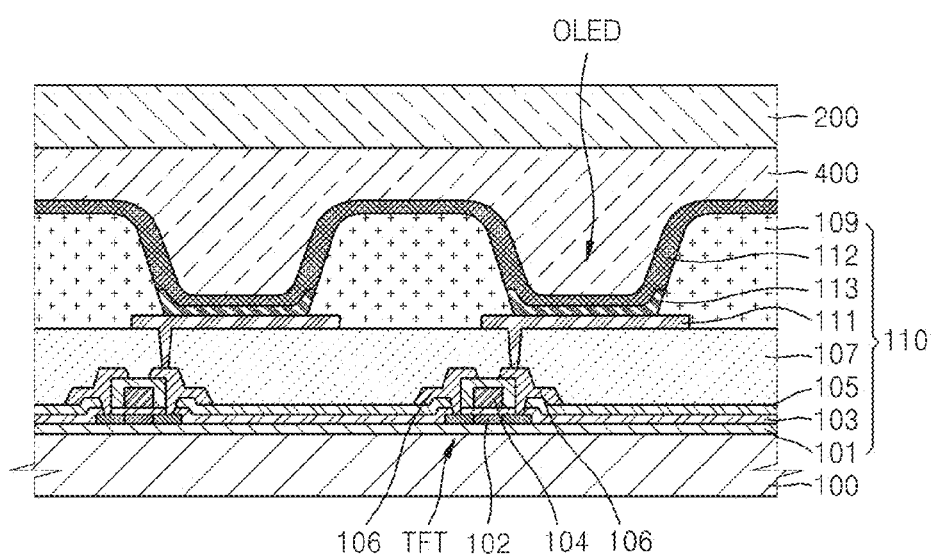
FIG. 2 is a cross-sectional view schematically illustrating a portion of the organic light emitting display device of the embodiment shown in FIG. 1.

FIG. 1 is a cross-sectional view schematically illustrating a cross section of an organic light emitting display device according to an embodiment of the present invention, and FIG. 2 is a cross-sectional view schematically illustrating a portion of the organic light emitting display device of the embodiment shown in FIG. 1.

Referring to FIGS. 1 and 2, an organic light emitting display device 10 may include a substrate 100, a display unit 110 arranged on the substrate 100, a sealing substrate 200 arranged on the display unit 110, a sealing member 300 for bonding the substrate 100 and the sealing substrate 200, and a filler 400 filling a gap between the substrate 100 and the sealing substrate 200.

The substrate 100 of the present embodiment may include transparent glass mainly composed of $SiO_2$, although it is not limited thereto, and may also be formed of a transparent plastic material. The plastic material for forming the substrate 100 may be an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

In a bottom emission type, in which an image is represented toward the substrate 100, the substrate 100 may be formed of a transparent material. However, in a top emission type, in which an image is projected in a direction opposite to the substrate 100, the substrate 100 does not need to be formed of a transparent material, and may be formed of metal, in which case it may include at least one selected from the group consisting of carbon, iron, chrome, manganese, nickel, titanium, molybdenum, stainless steel (SUS), INVAR alloy (INVAR is a registered trademark of Aperam Alloys IMPHY Joint Stock Company), INCONEL alloy (INCONEL is a registered trademark of Huntington Alloys Corporation), and KOVAR alloy (KOVAR is a registered trademark of Carpenter Technology Corporation). However, the substrate 100 is not limited thereto. The substrate 100 may be formed of metal foil.

A buffer layer 101 may be formed on an upper surface of the substrate 100 to impart smoothness and to reduce or block impure elements. The buffer layer 101 may be deposited by performing various deposition methods such as plasma enhanced chemical vapor deposition (PECVD), atmospheric pressure CVD (APCVD), and low pressure CVD (LPCVD) using $SiO_2$ and/or $SiN_x$. The buffer 101 need not be formed in other embodiments.

A thin film transistor (TFT) array is formed on the upper surface of the substrate 100. Although FIG. 2 illustrates that a single TFT is provided for each pixel, this is just an example, and the present invention is not limited thereto. Therefore, a plurality of TFTs and storage capacitors may be further provided.

The TFT is electrically connected to an organic light emitting device (OLED) to drive the OLED. The TFT illustrated in FIG. 2 is a top gate type and sequentially includes an active layer 102, a gate electrode 104, and source/drain electrodes 106. Although the present embodiment discloses the top gate type TFT, those skilled in the art would understand that various types of TFTs may be adopted without being limited to the TFT illustrated in the drawing.

The active layer 102 may be formed by forming an inorganic semiconductor layer such as a silicon layer and oxide semiconductor layer or an organic semiconductor layer over the substrate 100, and then patterning the inorganic or organic semiconductor layer. When forming the active layer 102 using silicon, an amorphous silicon layer may be formed over the substrate 100, and then the amorphous silicon layer may be crystallized to form a polycrystalline silicon layer. Then, the polycrystalline silicon layer is patterned, and source and drain regions on edges thereof are doped with impurities, thereby forming the active layer 102 including the source region, the drain region, and a channel region therebetween.

A gate dielectric 103 is formed of SiO2 and SiNx on the active layer 102, and the gate electrode 104 is formed on a region on the gate dielectric 103. The gate electrode 104 is electrically connected to a gate line that applies an on/off signal of the TFT.

An interlayer dielectric 105 is formed on the gate electrode 104 so that the source and drain electrodes 106 respectively contact the source and drain regions of the active layer 102 through a contact hole. The TFT formed in this manner is covered with a passivation layer 107 to be protected.

An inorganic insulating layer and/or an organic insulating layer may be used for the passivation layer 107. SiO2, SiNx, SiON, Al2O3, TiO2, Ta2O5, HfO2, ZrO2, BST, and PZT may be included in the inorganic insulating layer, and widely-used polymers (PMMA, PS), a polymer derivative having a phenol group, an acrylic polymer, an imidic polymer, an arylether polymer, an amidic polymer, a fluoric polymer, a p-xylene polymer, a vinyl alcohol polymer, and/or a blend thereof may be included in the organic insulating layer. The passivation layer 107 may also be formed as a complex laminated structure of the inorganic and organic insulating layers.

The OLED is provided at a light emitting region on the passivation layer 107. The light emitting region and a non-light emitting region will be described in connection with a pixel defining layer 109.

The OLED includes a pixel electrode 111 formed on the passivation layer 107, an opposing electrode 112 opposing the pixel electrode 111, and an intermediate layer 113 located therebetween. Display devices are classified into a bottom emission type, a top emission type, and a dual emission type according to a light emitting direction. According to the bottom emission type, the pixel electrode 111 is provided as a light-transmissive electrode, and the opposing electrode 112 is provided as a reflective electrode. According to the top emission type, the pixel electrode 111 is provided as a reflective electrode, and the opposing electrode 112 is provided as a transflective electrode. Although the embodiments of the present invention are described based on the bottom emission type herein, the embodiments of the present invention are not limited thereto.

The pixel electrode 111 is formed as a transparent layer including ITO, IZO, ZnO, or In2O3 having a high work function. The pixel electrode 111 may be patterned in the shape of an island corresponding to a pixel. The pixel electrode 111 may be coupled to an external terminal to function as an anode electrode.

The pixel defining layer (PDL) 109, which is an insulating material, is formed on the pixel electrode 111 to cover the pixel electrode 111. The pixel defining layer 109 may be formed by performing spin coating using at least one organic insulating material selected from the group consisting of polyimide, polyamide, acryl resin, benzocyclobutene, and phenol resin. A certain opening is formed in the pixel defining layer 109 to expose a center part of the pixel electrode 111, and an organic light emitting layer for emitting light to a limited region is deposited in the opening, thereby defining a light emitting region. When the light emitting regions are formed in the pixel defining layer 109 due to the openings, protruding parts are naturally formed among the light emitting regions, and these parts are defined as non-light emitting regions, since the organic light emitting layer is not formed therein.

The opposing layer 112 may be formed of Li, Ca, LiF/Ca, LiF/Al, Al, Mg, and Ag having a low work function. The opposing electrode 112 may be formed over the substrate 100 in the form of a common electrode. The opposing electrode 112 may be coupled to an external terminal to function as a cathode electrode.

The pixel electrode 111 and the opposing electrode 112 may have opposite polarities.

The intermediate layer 113 includes an organic light emitting layer for emitting light, and a low molecular organic material or a polymer organic material may be used for the organic light emitting layer. When the organic light emitting layer is a low molecular organic layer formed of the low molecular organic material, a hole transport layer (HTL) and a hole injection layer (HIL) are stacked in a direction of the pixel electrode 111 with respect to the organic light emitting layer, and an electron transport layer (ETL) and an electron injection layer (EIL) are stacked in a direction of the opposing electrode 112. Besides the hole injection layer, the hole transport layer, the electron transport layer, and the electron injection layer, other various layers may be stacked if necessary.

When the organic light emitting layer is a polymer organic layer formed of the polymer organic material, a structure including only the hole transport layer may be provided in a direction of the pixel electrode 111 with respect to the organic light emitting layer. The polymer hole transport layer is formed on the pixel electrode 111 by performing, for example, inject printing or spin coating using poly-(2,4)-ethylene-dihydroxy thiophene (PEDOT) or polyaniline (PANI).

The substrate 100 provided with the display unit 110 is bonded to the sealing substrate 200 arranged on the display unit 110. Instead of a glass material, a plastic material, such as acryl, or a metal plate, may be used for the sealing substrate 200.

The substrate 100 and the sealing substrate 200 are bonded by the sealing member 300. A typically used material, such as sealing glass frit, may be used for the sealing member 300. The sealing member 300 and the sealing substrate 200 blocks external moisture and air from the display unit 110.

A moisture absorbent 310 may be further provided between the sealing member 300 and the display unit 110. The moisture absorbent 310 easily reacts with (e.g., absorbs) moisture and oxygen to avoid deterioration of the OLED due to moisture and oxygen. The moisture absorbent 310 may be formed of, for example, one of alkali metal oxide, alkaline-earth metal oxide, metal halide, lithium sulfate, metal sulphate, metal perchlorate, silica gel, and phosphorous pentoxide or a mixture thereof. A type and arrangement of the moisture absorbent 310 are not limited to those described above.

The filler 400 is provided inside the sealing member 300 (e.g., portions of the sealing member are at sides of the filler). More specifically, the filler 400 is provided to fill a gap between the substrate 100 and the sealing substrate 200.

The filler 400 of the present embodiment, which may be a polymer obtained by polymerizing an adhesive component monomer and a cohesive component monomer, is a non-hardening type. Here, the non-hardening type indicates that additives, such as a hardening agent, a coupling agent, and an antioxidant as well as reactive resin, are not included to avoid being hardened by heat or ultraviolet light.

The adhesive component monomer may be, for example, at least one of butyl acrylate, 2-ethyl-hexyl acrylate, octyl acrylate, and ethyl acrylate, and the cohesive component monomer may be, for example, at least one of methyl methacrylate, styrene, methyl acrylate, and acrylonitrile, but the monomers are not limited thereto.

The adhesive component monomer may be included in the filler 400 in a range from about 10 mol % to about 90 mol %, for example, and the cohesive component monomer may be included in the filler 400 in a range from about 10 mol % to about 90 mol %. More specifically, the adhesive component monomer may be included in the filler 400 in a range from about 60 mol % to about 80 mol %, and the cohesive component monomer may be included in the filler 400 in a range from about 20 mol % to about 40 mol %, for example. If amounts of the adhesive component monomer and the cohesive component monomer are out of the ranges, material properties of the filler 400, such as a molecular weight (Mw), glass transition temperature Tg, hardness, and modulus, may be changed, and may thereby cause a defect such as a dark spot.

The filler 400 may have a molecular weight (Mw) of about 100 kg/mol to about 5,000 kg/mol. If the molecular weight (Mw) of the filler 400 is smaller than about 100 kg/mol, a demolding defect may occur due to increased tackiness (e.g., stickiness). Further, since low molecular material content increases, reliability may be degraded during prolonged use. However, if the molecular weight of the filler 400 is greater than about 5,000 kg/mol, forming the filler 400 may be difficult, and it may be difficult to uniformly form the filler 400 because hardness increases. Therefore, the filler 400 of the present embodiment may have the molecular weight (Mw) ranging from about 100 kg/mol to about 5,000 kg/mol. When the filler 400 has the molecular weight (Mw) of this range, additional thermosetting or UV curing is not necessary for the filler 400.

The filler 400 has the glass transition temperature Tg ranging from about −30° C. to about 30° C. Therefore, adhesiveness is excellent at room temperature, and a process of applying the filler 400 onto the sealing substrate 200 may be relatively easily performed. When the filler 400 has the glass transition temperature Tg in this range, polymer chains of the filler 400 are flexible. Therefore, stress generated by particles may be effectively reduced, thereby avoiding damage to the display unit 110.

When the temperature is about 100° C., a thermal change ratio of the filler 400 (e.g., a change in size or density due to thermal expansion) may be about 2% or less.

Figure 3:
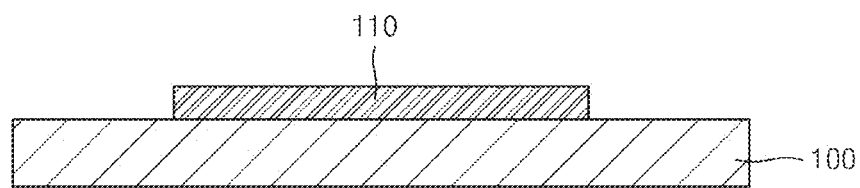
FIGS. 3 to 5 are schematic cross-sectional views illustrating a method of manufacturing the organic light emitting display device of the embodiment shown in FIG. 1.
Figure 4:
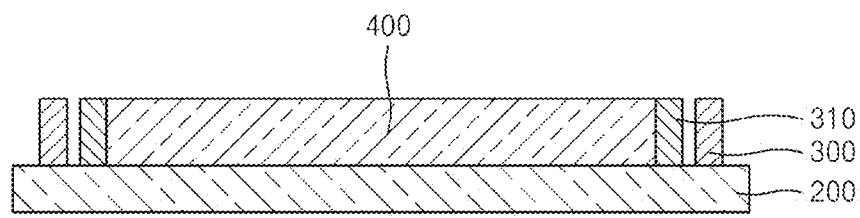
Figure 5:
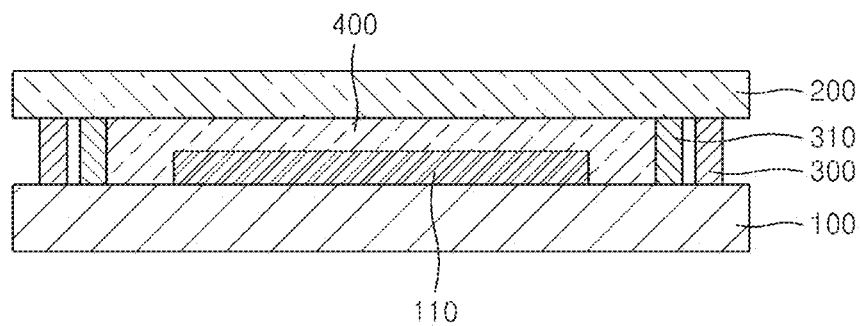

FIGS. 3 to 5 are schematic cross-sectional views illustrating a method of manufacturing the organic light emitting display device of the embodiment shown in FIG. 1.

With reference to FIGS. 3 to 5, the method of manufacturing the organic light emitting display device according to an embodiment of the present invention will be described. Firstly, as illustrated in FIG. 3, the display unit 110 is formed on one side of the substrate 10. Since the display unit 110 has been described above with reference to FIGS. 1 and 2, and various well-known organic light emitting displays may be applied, a detailed description of a method of manufacturing the display unit 110 is omitted.

Next, as illustrated in FIG. 4, a polymer 400 is applied on one side of the sealing substrate 200. The polymer 400, which is obtained by polymerizing an adhesive element monomer and a cohesive element monomer, is the same as the filler 400. That is, the terms filler 400 and polymer 400 may be interchangeably used herein.

The adhesive component monomer may be, for example, at least one of butyl acrylate, 2-ethyl-hexyl acrylate, octyl acrylate, and ethyl acrylate, and the cohesive component monomer may be, for example, at least one of methyl methacrylate, styrene, methyl acrylate, and acrylonitrile.

The polymer 400 may be formed by suspension-polymerizing or solution-polymerizing the adhesive component monomer and cohesive component monomer with a small amount of initiator, and then by removing the initiator and unreactive material by performing solvent cleaning and heat treatment.

Benzoyl peroxide, di-tert-butyl peroxide, azobisisobutyronitrile, and azobenzene may be used as the initiator, although the initiator is not limited thereto.

If the initiator remains in the polymer 400, the remaining initiator may affect the organic light emitting device, and the molecular weight (Mw) of the polymer 400 may be decreased when initiator content increases. Therefore, the amount of initiator used may be a minimal amount needed. The initiator content of the present embodiment is about 1 mol % or less.

The polymer 400 prepared in this manner has a relatively large molecular weight of about 100 kg/mol to about 5,000 kg/mol, and may be applied on one side of the sealing substrate 200 by performing, for example, screen printing. When viscosity of the polymer 400 is relatively high, the polymer 400 may be prepared in the shape of a film and then may be bonded to one side of the sealing substrate 200.

After applying the polymer 400 on one side of the sealing substrate 200, the sealing member 300 is formed to surround the polymer 400. The sealing member 300 may be applied in a liquid phase or in a paste state. Although the drawing illustrates that the sealing member 300 is formed on one side of the sealing substrate 200, the present invention is not limited thereto. For example, the sealing member 300 may be formed on one side of the substrate 100.

Although it has been described that the polymer 400 is formed before the sealing member 300 is formed, the present invention is not limited thereto. That is, if the polymer 400 has relatively low viscosity, the polymer 400 may be dispensed to be applied. The polymer 400 may be irregularly pushed out by pressure while being dispensed. To overcome this limitation, the sealing member 300 may be firstly formed, and then the polymer 400 may be dispensed and applied.

The moisture absorbent 310 may be further formed inside the sealing member 300, and also may be applied in a liquid phase.

Next, as illustrated in FIG. 5, the substrate 100 and the sealing substrate 200 are bonded by using the sealing member 300 as a medium.

In detail, the substrate 100 and the sealing substrate 200 are arranged to oppose each other, and ultraviolet light may be radiated to the substrate 100 and sealing substrate 200 (e.g., at areas of the substrates 100 and 200 corresponding to the sealing member 300) in a vacuum, thereby bonding the substrate 100 and the sealing substrate 200. Infiltration of external moisture and foreign materials may be reduced by performing the bonding in a vacuum. If the ultraviolet light is radiated to the substrate 100 and the sealing substrate 200, portions contacting with the sealing member 300 melt so that the substrate 100 and the sealing substrate 200 are bonded. However, this is just an exemplary method, and the substrate 100 and the sealing substrate 200 may be bonded using various methods according to a type of the sealing member 300.

When the ultraviolet light is radiated to bond the substrate 100 and the sealing substrate 200, the polymer 400 described with reference to FIG. 4 does not react with the light, and remains unhardened.

Hereinafter, embodiments of the present invention will be described in more detail with reference to examples. The following examples are just for describing embodiments of the present invention in detail, not intending to limit the present invention.

Preparation Example 1: Preparation of Non-Hardening Type Polymer (1)

About 60 mol % of butyl acrylate as the adhesive component monomer, and about 40 mol % of styrene as the cohesive component monomer, were suspension-polymerized with a smaller amount of the initiator to prepare acryl resin, and then the initiator and unreactive material were removed by performing cleaning and heat treatment. Benzoyl peroxide was used for the initiator, the cleaning was performed with DI water, and the heat treatment was performed at a temperature of about 100° C. for about 30 minutes. The molecular weight of the formed polymer was about 600 kg/mol, the temperature Tg was about 5° C., and an expansion rate at a temperature of about 80° C. was about 0.5% or less.

Preparation Example 2: Preparation of Non-Hardening Type Polymer (2)

The polymer was prepared in the same manner as described in Preparation Example 1, except that about 80 mol % of methyl acrylate as the adhesive component monomer, and about 20 mol % of styrene as the cohesive component monomer were used.

Preparation Example 3: Preparation of Non-Hardening Type Polymer (3)

The polymer was prepared in the same manner as described in Preparation Example 1, except that about 70 mol % of ethyl acrylate as the adhesive component monomer, and about 30 mol % of methyl methacrylate as the cohesive component monomer were used.

Comparative Example: Preparation of Hardening Type Polymer

About 88 mol % of low molecular bisphenol A-type epoxy (bisphenol A diglycidyl ether) resin (0.4 kg/mol) for adhesive characteristics, and about 1 mol % of polymeric phenoxy resin (50 kg/mol) for paint film characteristics, were liquidized with about 11 mol % of a hardening agent 2MAOK-PW to prepare a filler. In addition, small amounts of an antioxidant (Quinone) and a coupling agent (KBM403) were added.

Evaluation Example 1: Dark Point and Pixel Shrinkage

Figure 6:
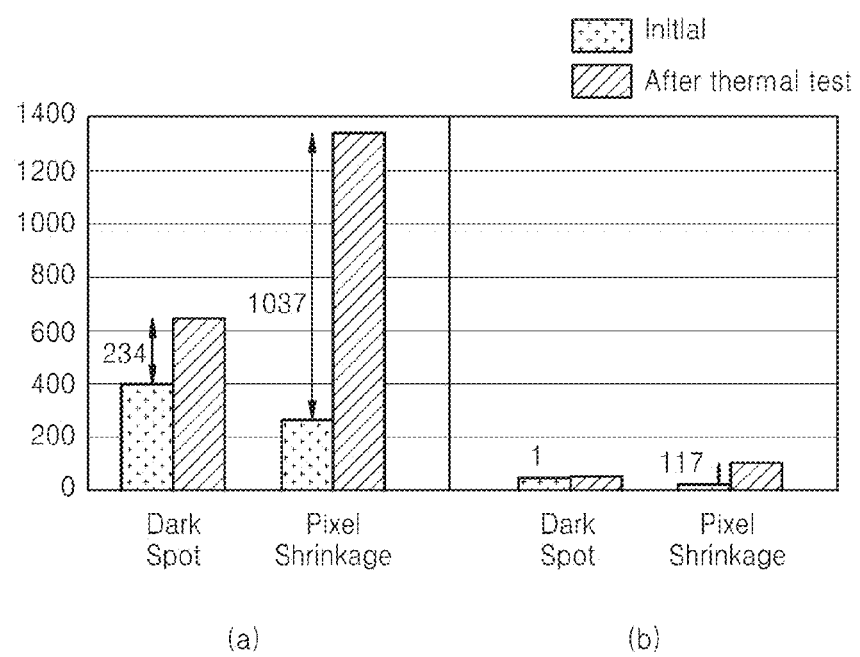
FIGS. 6 and 7 are diagrams illustrating that dark points and pixel shrinkages are reduced in the organic light emitting display device of the embodiment shown in FIG. 1.
Figure 7:
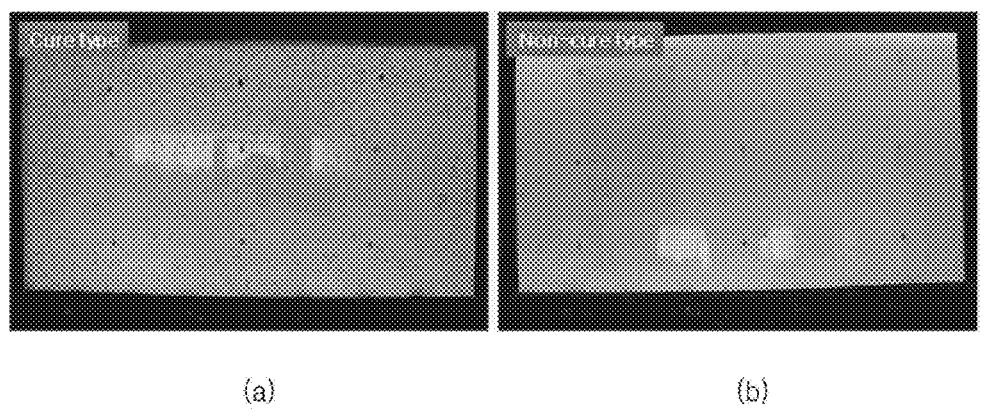

FIGS. 6 and 7 are diagrams illustrating that the number of dark points and pixel shrinkages are reduced in the organic light emitting display device of the embodiment in FIG. 1 (e.g., when compared to a conventional organic light emitting display device).

In detail, FIGS. 6(*a*) and 7(*a*) illustrate results of using the polymer prepared in the Comparative Example as the filler, while FIGS. 6(*b*) and 7(*b*) illustrate results of using the polymer prepared in Preparation Example 1 as the filler.

The polymer of the Comparative Example is a hardening type. All of FIGS. 6(*a*), 6(*b*), 7(*a*), and 7(*b*) illustrate the result after heat treatment is performed at a temperature for hardening the polymer of the Comparative Example.

Referring to FIG. 6(*a*), after the heat treatment, dark spots increase by as much as 234, and pixel shrinkages increase by as much as 1037. On the contrary, referring to FIG. 6(*b*), the dark spots increase by as much as 1 and the pixel shrinkages increase by as much as 117. Accordingly, defects such as dark spots and pixel shrinkage are remarkably reduced when using the polymer prepared in Preparation Example 1 as the filler. These results are shown in FIG. 7. Further, FIG. 6(*b*) illustrates that a progressive defect that increases as time passes is also decreased.

It is generally known that dark spots may be generated due to damage to a circuit of a substrate by foreign materials, and pixel shrinkage may be generated due to out gas (e.g., offgassing) of a filler.

That is, since a typical hardening type filler includes an organic material such as a binder having strong reactivity, the out gas is generated by the heat applied for hardening the filler or by the heat generated from a display unit, thereby causing the defect such as the pixel shrinkage.

On the contrary, the filler according to the present embodiment is a non-hardening type, and does not include an organic material having strong reactivity, and thus has excellent stability against heat, and reduces or minimizes generation of gas, thereby avoiding defects, or the extent thereof, such as the pixel shrinkage. Further, the filler according to the present embodiment is a non-hardening type and is flexible. Therefore, stress generated by particles may be effectively reduced, thereby preventing the damage caused by foreign materials.

Although FIGS. 6 and 7 illustrate the results of Preparation Example 1, it was confirmed that examples 2 and 3 have similar results.

Evaluation Example 2: Heat Expansion

Figure 8:
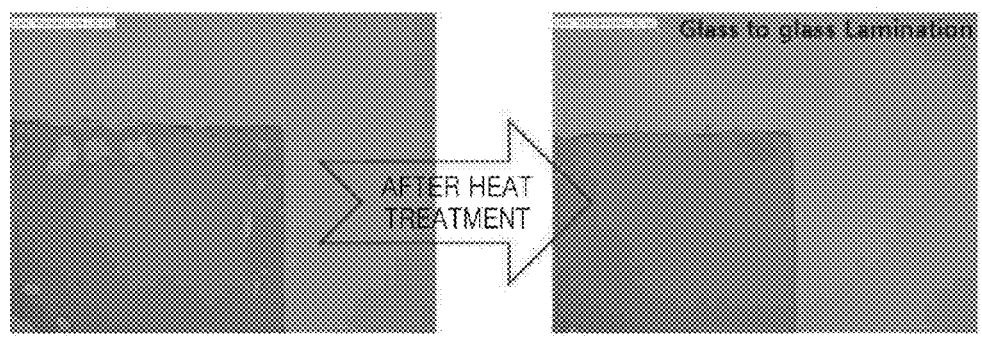
FIG. 8 illustrates heat expansion of the filler of the organic light emitting display device of the embodiment shown in FIG. 1.

FIG. 8 illustrates heat expansion of the filler of the organic light emitting display device of FIG. 1. In detail, FIG. 8 illustrates the heat expansion after applying the polymer prepared in Preparation Example 1 on one side of the sealing substrate and performing heat treatment at a temperature of about 100° C. for about 2 hours. As illustrated in FIG. 8, it may be understood that there is no flow even if the heat treatment is performed. This is because the filler is formed of a material having a high molecular weight to control the flow of the filler. Although not illustrated in the drawing, it was confirmed that there is no flow of the filler after the heat treatment is performed at a temperature of about 85° C. for about at least 1000 hours.

According to the above-described organic light emitting display device and the method of manufacturing the same, organic materials which strongly react with a filler are not included, and thus the defects such as the dark spot and the pixel shrinkage can be reduced.

Further, since the filler is a non-hardening type, the stress generated by particles may be effectively reduced, thereby preventing or reducing damage to the display unit.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An organic light emitting display device comprising:
a substrate;
a display unit on the substrate;
a sealing substrate on the display unit;
a sealing member around the display unit and bonding the substrate and the sealing substrate;
a moisture absorbent inside the sealing member, the moisture absorbent extending from the substrate to abut the sealing substrate; and
a filler inside the moisture absorbent and filling a gap between the substrate and the sealing substrate,
wherein the filler is a non-hardening filler which is adapted to not harden when exposed to heat or ultraviolet light, and a molar mass of the filler is from about 100 kg/mol to about 5,000 kg/mol, and
wherein the filler comprises a polymer consisted of adhesive component monomer and cohesive component monomer,
wherein the filler comprises at least one of methyl methacrylate, styrene, ethyl acrylate, or acrylonitrile.

2. The organic light emitting display device of claim 1, wherein a glass transition temperature of the filler is from about −30° C. to about 30° C.

3. The organic light emitting display device of claim 1, wherein the filler comprises the adhesive component monomer in a range from about 10 mol % to about 90 mol %, and the cohesive component monomer in a range from about 10 mol % to about 90 mol %.

4. The organic light emitting display device of claim 3, wherein the filler comprises the adhesive component monomer in a range from about 60 mol % to about 80 mol %, and the cohesive component monomer in a range from about 20 mol % to about 40 mol %.

5. The organic light emitting display device of claim 1, wherein the adhesive component monomer comprises at least one of butyl acrylate, 2-ethyl-hexyl acrylate, octyl acrylate, or ethyl acrylate.

6. The organic light emitting display device of claim 1, wherein a thermal change ratio of the filler is about 2% or less when a temperature is about 100° C.

7. The organic light emitting display device of claim 1, wherein the filler covers the display unit.

8. An organic light emitting display device comprising:
a substrate;
a display unit on the substrate;
a sealing substrate on the display unit;
a sealing member bonding the substrate and the sealing substrate, and sealing the display unit;
a moisture absorbent inside the sealing member, the moisture absorbent extending from the substrate to abut the sealing substrate; and
a filler inside the moisture absorbent and filling a gap between the substrate and the sealing substrate,
wherein the filler comprises a non-hardening polymer filler which is adapted to not harden when exposed to heat or ultraviolet light, comprising only adhesive component monomer and cohesive component monomer,
wherein the filler comprises at least one of methyl methacrylate, styrene, methyl acrylate, or acrylonitrile.

9. The organic light emitting display device of claim 8, wherein a glass transition temperature of the filler is from about −30° C. to about 30° C., and a molar mass of the filler is from about 100 kg/mol to about 5,000 kg/mol.

10. The organic light emitting display device of claim 8, wherein the filler comprises the adhesive component monomer in a range from about 10 mol % to about 90 mol %, and the cohesive component monomer in a range from about 10 mol % to about 90 mol %.

11. The organic light emitting display device of claim 10, wherein the filler comprises the adhesive component monomer in a range from about 60 mol % to about 80 mol %, and the cohesive component monomer in a range from about 20 mol % to about 40 mol %.

12. The organic light emitting display device of claim 8, wherein the adhesive component monomer comprises at least one of butyl acrylate, 2-ethyl-hexyl acrylate, octyl acrylate, or ethyl acrylate.

* * * * *